(12) United States Patent
Katagiri et al.

(10) Patent No.: US 8,372,693 B2
(45) Date of Patent: Feb. 12, 2013

(54) SEMICONDUCTOR DEVICE INCLUDING SEMICONDUCTOR CHIPS WITH DIFFERENT THICKNESS

(75) Inventors: Mitsuaki Katagiri, Tokyo (JP); Hisashi Tanie, Tokyo (JP); Jun Kayamori, Tokyo (JP); Dai Sasaki, Tokyo (JP); Hiroshi Moriya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/538,654

(22) Filed: Jun. 29, 2012

(65) Prior Publication Data
US 2012/0302007 A1 Nov. 29, 2012

Related U.S. Application Data

(63) Continuation of application No. 12/357,895, filed on Jan. 22, 2009, now Pat. No. 8,237,251.

(30) Foreign Application Priority Data

Jan. 23, 2008 (JP) ................. 2008-012816

(51) Int. Cl.
*H01L 23/02* (2006.01)
*H01L 23/485* (2006.01)
*H01L 25/10* (2006.01)

(52) U.S. Cl. ........ 438/109; 257/686; 257/737; 257/777; 257/E23.021; 257/E25.023

(58) Field of Classification Search ................. 257/678, 257/686, 737, 777, E23.021, E25.023; 438/109
See application file for complete search history.

(56) References Cited

U.S. PATENT DOCUMENTS
2006/0172459 A1   8/2006   Karnezos

FOREIGN PATENT DOCUMENTS
JP      2005-026680 A     1/2005
JP      2007-165454 A     6/2007

OTHER PUBLICATIONS

Amkor Technology Data Sheet Package on Package (PoP) Family, Revisions date May 2005.

*Primary Examiner* — Lynne Gurley
*Assistant Examiner* — Vernon P Webb
(74) *Attorney, Agent, or Firm* — Sughrue Mion, PLLC

(57) ABSTRACT

In a stacked-type semiconductor device, a first semiconductor device and at least one second semiconductor device are stacked. The first semiconductor device includes a wiring board and a first semiconductor chip mounted on the wiring board. The second semiconductor device includes a wiring board and a second semiconductor chip mounted on the wiring board. The thickness of the second semiconductor chip of each second semiconductor device is thicker than the thickness of the first semiconductor chip.

20 Claims, 5 Drawing Sheets

SEMICONDUCTOR DEVICE INCLUDING SEMICONDUCTOR CHIPS WITH DIFFERENT THICKNESS

CROSS-REFERENCE TO RELATED APPLICATIONS

This application is a Continuation of U.S. application Ser. No. 12/357,895 filed Jan. 22, 2009 which claims the benefit of priority from Japanese patent application No. 2008-012816, filed on Jan. 23, 2008. The entire disclosures of the prior applications are incorporated herein in its entirety by reference.

BACKGROUND OF THE INVENTION

1. Field of the Invention

The present invention relates to a semiconductor device having a structure in which a plurality of semiconductor devices are stacked.

2. Description of the Related Art

In recent years, demand for larger memory capacity has further increased. However, due to factors, such as the larger scale, the complexity of peripheral circuits, and the difficulty of shortening of manufacturing process, it is difficult to decrease the area of a semiconductor chip. To achieve larger capacity and higher integration, Japanese Patent Laid-Open No. 2007-165454 describes a chip-stacked-type semiconductor device in which the same or different types of semiconductor chips are stacked.

Also, a stacked-type semiconductor device in which a plurality of semiconductor devices are stacked is known (see Japanese Patent Laid-Open No. 2005-26680). In the stacked-type semiconductor device described in Japanese Patent Laid-Open No. 2005-26680, a plurality of semiconductor devices having a BGA (Ball Grid Array) structure are stacked. Further, a semiconductor device having an sFBGA (stacked FBGA) structure that is a stacked-type semiconductor device in which a plurality of semiconductor devices of an FBGA (Fine pitch Ball Grid Array) structure are stacked is also known.

For high-speed DRAM (Dynamic Random Access Memory), such as DDR2 (Double Data Rate 2) and DDR3 (Double Data Rate 3), a standard for the arrangement of the external connection terminals (for example, solder balls) of a semiconductor device is provided by JEDEC (Joint Electron Device Engineering Council) that is an industry organization promoting the standardization of electronic parts. The restriction on the positions of the connection terminals according to this standard is one of the factors that account for the difficulty in improving the mechanical reliability of the semiconductor device.

Restrictions, such as the JEDEC standard, apply to the positions of external connection terminals which are used to connect the above described stacked-type semiconductor device to a motherboard. Also, inter-board connection terminals (for example, solder balls) that connect the wiring boards of adjacent semiconductor devices among stacked semiconductor devices are arranged to avoid a lower-layer semiconductor chip. Therefore, generally, the arrangement of the above external connection terminals and the arrangement of the above inter-board connection terminals are different.

In the stacked-type semiconductor device, due to a difference in the linear expansion coefficient between the semiconductor chip and the wiring board, warpage is caused by heat during use. Such warpage applies a load to the connection terminals and therefore is one factor that accounts for a reduction in the connection life of the connection terminals. Japanese Patent Laid-Open No. 2007-165454 describes a configuration in which warpage is reduced in a chip-stacked-type semiconductor device in which a plurality of semiconductor chips having different sizes are stacked on a wiring board. This chip-stacked-type semiconductor device comprises a dummy chip on the top-layer semiconductor chip. The dummy chip and the plurality of semiconductor chips are sealed together by resin. The amount of resin on the semiconductor chips is reduced by the dummy chip, so that warpage is relieved.

However, in the chip-stacked-type semiconductor device described in Japanese Patent Laid-Open No. 2007-165454, the plurality of semiconductor chips are sealed together by resin, so that if even one malfunctioning semiconductor chip is present, all semiconductor chips become unusable.

Japanese Patent Laid-Open No. 2005-26680 describes a stacked-type semiconductor device in which a plurality of semiconductor devices are stacked. In the stacked-type semiconductor device described in Japanese Patent Laid-Open No. 2005-26680, due to a difference in linear expansion coefficient between the semiconductor chip and other members, the shear deformation of the connection terminals increases, so that reliability of the connection terminals decreases. In the stacked-type semiconductor device having an sFBGA structure, the plurality of semiconductor chips are not sealed together by resin. Thus, even if there is one malfunctioning semiconductor chip present, all of the other semiconductor chips will not become unusable.

Also, in the stacked-type semiconductor device having an sFBGA structure, the bottom-layer semiconductor device is bound to a motherboard by external connection terminals. Thus, the shear deformation of the connection terminals connecting the motherboard and the bottom-layer semiconductor device is reduced. However, semiconductor devices stacked above the bottom-layer semiconductor device are not bound to the motherboard. Therefore, a large difference in warpage between the bottom-layer semiconductor device and the semiconductor devices above the bottom-layer semiconductor device occurs. Therefore, a large load is applied to inter-board connection terminals that connect the semiconductor devices in layers. Due to this load, the connection life of the connection terminals decreases, and the reliability of the semiconductor device is reduced. Therefore, one problem is to ensure the reliability of the inter-board connection terminals that connect the semiconductor devices in layers to each other.

In the case of the stacked-type semiconductor device in which the positions of the external connection terminals and the positions of the inter-board connection terminals are different, as described above, the warpage of the semiconductor devices in layers is necessarily different. Therefore, there is a problem in which a large load is applied to the inter-board connection terminals, resulting in a reduction of the connection life.

In order to ensure the reliability of the inter-board connection terminals, it is effective to reduce the difference in warpage in adjacent semiconductor devices that are interconnected by the inter-board connection terminals.

SUMMARY

The present invention seeks to solve one or more of the above problems, or to improve upon those problems at least in part.

According to one embodiment, a stacked-type semiconductor device comprises a first semiconductor device and at least one second semiconductor device. The first semiconductor device comprises a wiring board and a first semiconductor chip mounted on the wiring board. The second semiconductor device comprises a wiring board and a second semiconductor chip mounted on the wiring board. The second semiconductor device is stacked on the first semiconductor device. The thickness of the second semiconductor chip of each second semiconductor device is thicker than the thickness of the first semiconductor chip.

According to this configuration, the warpage of the semiconductor devices due to heat during use can be relieved.

The above and other objects, features and advantages of the present invention will become apparent from the following description with reference to the accompanying drawings which illustrate examples of the present invention.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Figure 1:
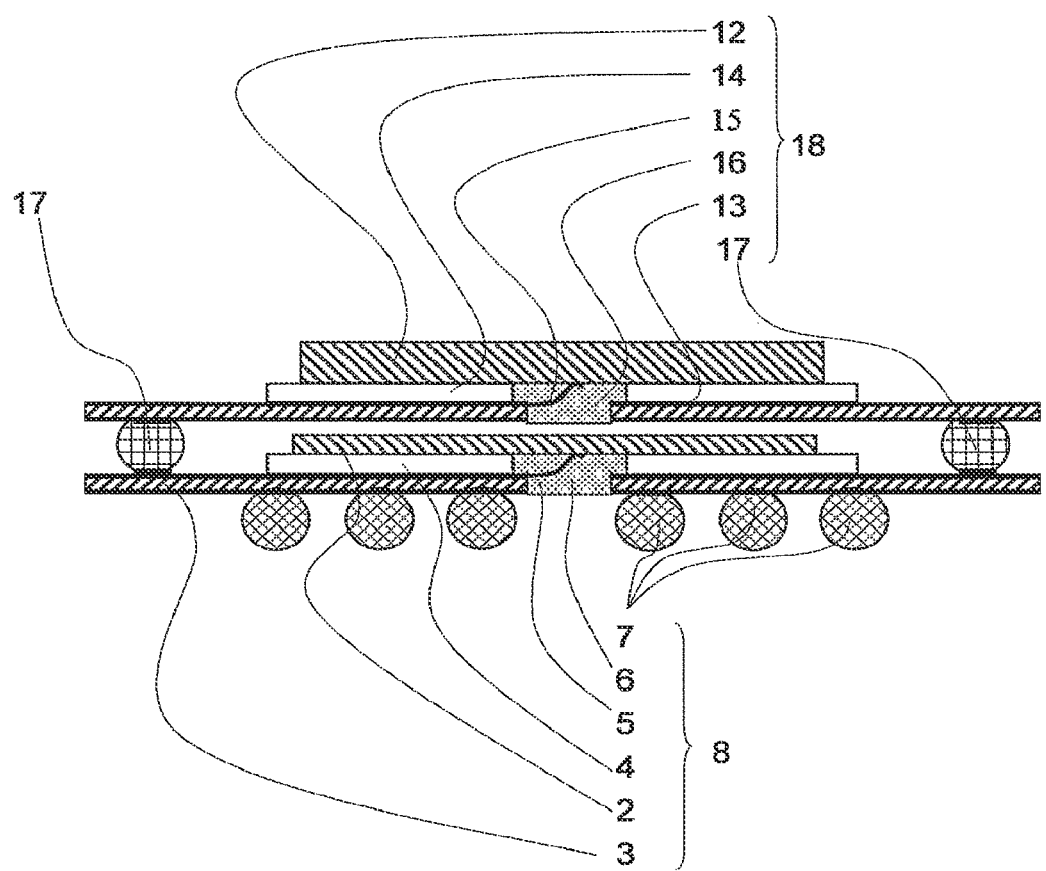
FIG. 1 is a schematic cross-sectional view of a stacked-type semiconductor device according to a first exemplary embodiment.

FIG. 1 is a schematic cross-sectional view of a stacked-type semiconductor device according to a first exemplary embodiment. In the stacked-type semiconductor device in this exemplary embodiment, first FBGA type semiconductor device 8 and second FBGA type semiconductor device 18 are stacked. First semiconductor device 8 comprises first silicon chip 2 that is a first semiconductor chip, tape board 3 that is a wiring board, and solder balls 7 that are external connection terminals.

Tape board 3 is formed of polyimide with a thickness of about 50 μm. Copper wiring with a thickness of about 20 μm is provided on both surfaces of the polyimide. First silicon chip 2 is mounted on tape board 3 via elastomer 4. Elastomer 4 is a low elastic body with a thickness of about 100 μm.

Part of the above copper wiring protrudes from tape board 3 and forms lead 5. Lead 5 is connected to a pad (not shown) provided in the center of first silicon chip 2. Thus, first silicon chip 2 and tape board 3 are electrically connected. Lead 5 and the pad are sealed by resin 6. Resin 6 is provided to ensure the reliability of first semiconductor device 8 for a long period. Solder balls 7 are provided on tape board 3.

In this exemplary embodiment, a through-hole is formed in the center of tape board 3. Lead 5 is connected to first silicon chip 2 through the through-hole. The through-hole is filled with the above resin 6.

Second semiconductor device 18 is of a structure substantially similar to that of first semiconductor device 8. Second semiconductor device 18 includes second silicon chip 12 that is a second semiconductor chip, tape board 13 that is a wiring board, and solder balls 17 that are inter-board connection terminals. Tape board 13 is formed of polyimide with a thickness of about 50 μm. Copper wiring with a thickness of about 20 μm is provided on both surfaces of the polyimide. Second silicon chip 12 is mounted on tape board 13 via elastomer 14. Elastomer 14 is a low elastic body with a thickness of about 100 μm. Part of the above copper wiring protrudes from tape board 13 and forms lead 15. Lead 15 is connected to a pad (not shown) provided in the center of second silicon chip 12. Lead 15 and the pad are sealed by resin 16. Solder balls 17 are provided on tape board 13 and connected to tape board 3 in first semiconductor device 8.

The arrangement of solder balls 7 that are external connection terminals is a grid-like arrangement conforming to the JEDEC standard. On the other hand, a first portion of solder balls 17, that is inter-board connection terminals, is arranged near by one edge of tape board 13 and arranged in line along the one edge of tape board 13. Moreover, a remaining portion of solder balls 17, that is inter-board connection terminals, is arranged near by the opposed edge of tape board 13 that faces the one edge of tape board 13 and arranged in line along the opposed edge that faces the one edge of tape board 13.

The thickness of second silicon chip 12 in second semiconductor device 18 is thicker than the thickness of first silicon chip 2 in first semiconductor device 8. In this exemplary embodiment, as one example, the thickness of first silicon chip 2 is 190 μm, and the thickness of second silicon chip 12 is 300 μm. By making the thickness of second silicon chip 12 thicker than the thickness of first silicon chip 2 in this manner, the warpage of second semiconductor device 18 due to heat during use is relieved. In the stacked-type semiconductor device mounted on a motherboard (not shown), tape board 3 and the motherboard are connected via solder balls 7 arranged like a grid. The rigidity of the motherboard is large, so that the warpage of first semiconductor device 8 is small. Therefore, by making second silicon chip 12 thick, the difference in warpage between first semiconductor device 8 and second semiconductor device 18 is reduced. Therefore, the load applied to solder balls 17 is reduced. Thus, the connection life of solder balls 17 is long, and the reliability of the stacked-type semiconductor device is improved.

The results of stress analysis by a finite element analysis performed on the stacked-type semiconductor device according to the first exemplary embodiment will be described below. The shape of the stacked-type semiconductor device is mirror-symmetrical with respect to two orthogonal mirror planes including the centerline (a straight line orthogonal to the major surfaces of tape boards 3 and 13 and passing through the center of the stacked-type semiconductor device). Due to this symmetry, analysis can be performed using a finite element model of the stacked-type semiconductor device having a shape that is cut in the two mirror planes. The stress analysis was performed on the finite element model for analyzing stress in a stacked-type semiconductor device mounted on a motherboard.

Figure 2A:
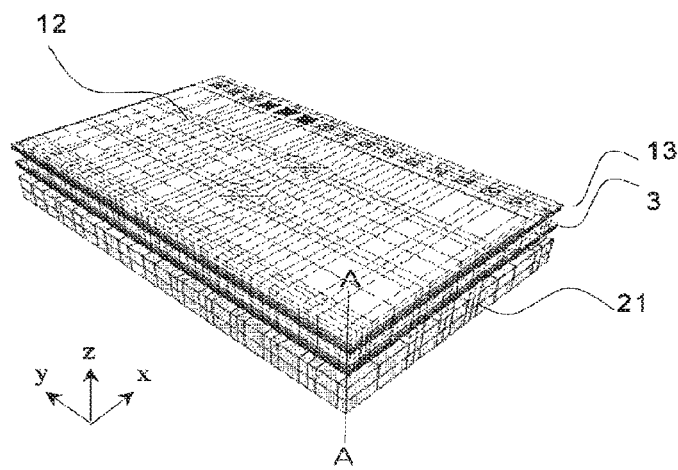
FIG. 2A is a perspective view of a finite element model for analyzing stress in the stacked type semiconductor device.
Figure 2B:
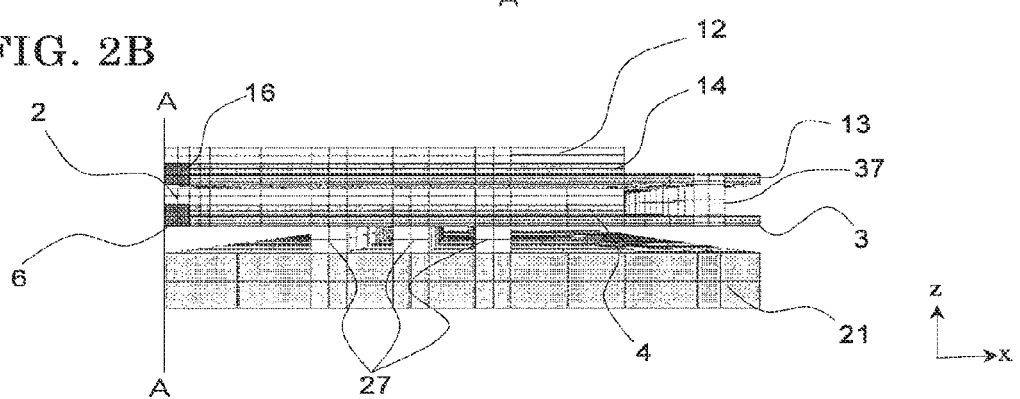
FIG. 2B is a side view of the finite element model of FIG. 2A.
Figure 2C:
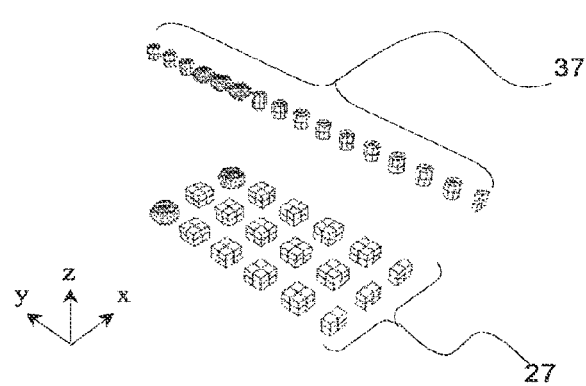
FIG. 2C is a schematic view showing the positions of the solder bumps in the finite element model of FIG. 2A.

FIG. 2A is a perspective view of the finite element model for analyzing stress in the stacked type semiconductor device, and FIG. 2B is a side view of the finite element model. Also, FIG. 2C is a view in which only the positions of the internal and external connection terminals in the finite element model of FIG. 2A are shown. Also, the line A-A of FIGS. 2A to 2B shows the centerline of the stacked-type semiconductor device.

Here, the thickness of first silicon chip 2 was 190 µm, and the thickness of second silicon chip 12 was 300 µm in the finite element model. Also, based on the properties of the actual constituent parts, the linear expansion coefficient of first and second silicon chips 2 and 12 was smaller than the linear expansion coefficients of tape boards 3 and 13 and elastomers 4 and 14. The external connection terminals and the inter-board connection terminals were solder bumps 27 and 37 (including solder balls) in the finite element model. Solder bumps 27 and 37 were elastoplastic bodies, and other materials were elastic bodies in the finite element model.

Stress analysis simulating a temperature cycle test in which the high temperature was 125° C. and the low temperature was −25° C. was performed by the finite element model of the above configuration. Thus, the warpage deformation of tape boards 3 and 13, and the strain that occurs in solder bumps 37 were evaluated.

Figure 3A:
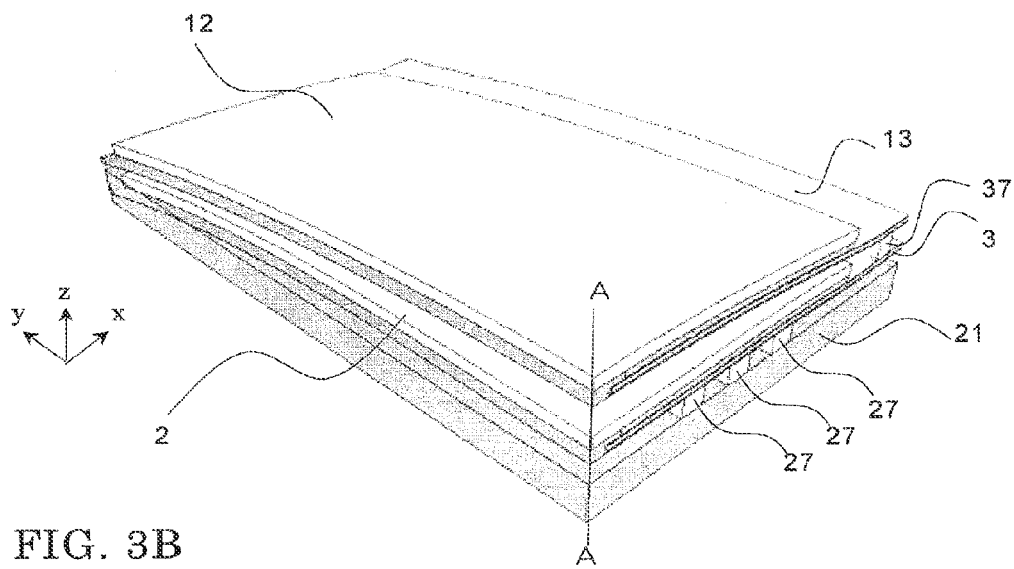
FIG. 3A is a perspective view of the finite element model when the temperature is decreased.
Figure 3B:
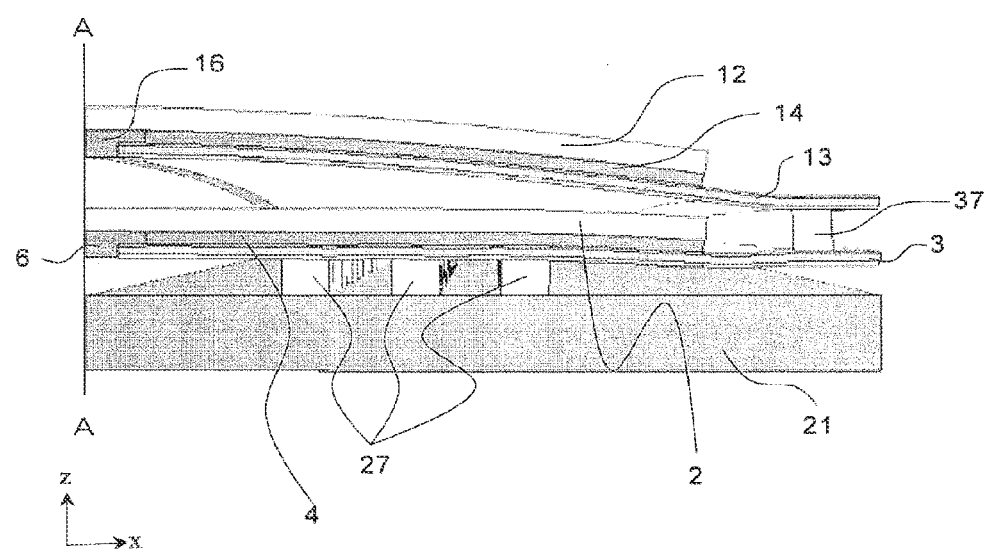
FIG. 3B is a side view of the finite element model when the temperature is decreased.

FIGS. 3A and 3B are views explaining strain that occurs in the finite element model of the stacked-type semiconductor device when the temperature is decreased from 125° C. to −25° C. FIG. 3A is a perspective view of the finite element model in which strain occurs, and FIG. 3B is a side view of the finite element model. However, in FIGS. 3A and 3B, the state in which the deformation rate is increased is shown. Convex warpage deformation occurs in the upper portion of second semiconductor device 18 because a difference in the deformation amount between silicon chip 12 having a small linear expansion coefficient, and tape board 13 and elastomer 14 having large linear expansion coefficients, occurs. On the other hand, tape board 3 near solder bumps 27 that are external connection terminals is constrained by motherboard 21, so that the warpage deformation of first semiconductor device 8 is small. Due to the difference in warpage deformation between first semiconductor device 8 and second semiconductor device 18, a load is applied to solder bumps 37 that are inter-board connection terminals. Thus, when a load is repeatedly applied due to temperature change, there is the concern that solder bumps 37 will suffer fatigue failure.

TABLE 1

| thickness of second silicon chip (µm) | thickness of first silicon chip (µm) | equivalent plastic strain range of solder bumps that are inter-board connection terminals (%) |
|---|---|---|
| 190 | 190 | 1.28 |
| 200 | 190 | 1.25 |
| 220 | 190 | 1.20 |
| 240 | 190 | 1.15 |
| 300 | 190 | 0.97 |

Figure 4:
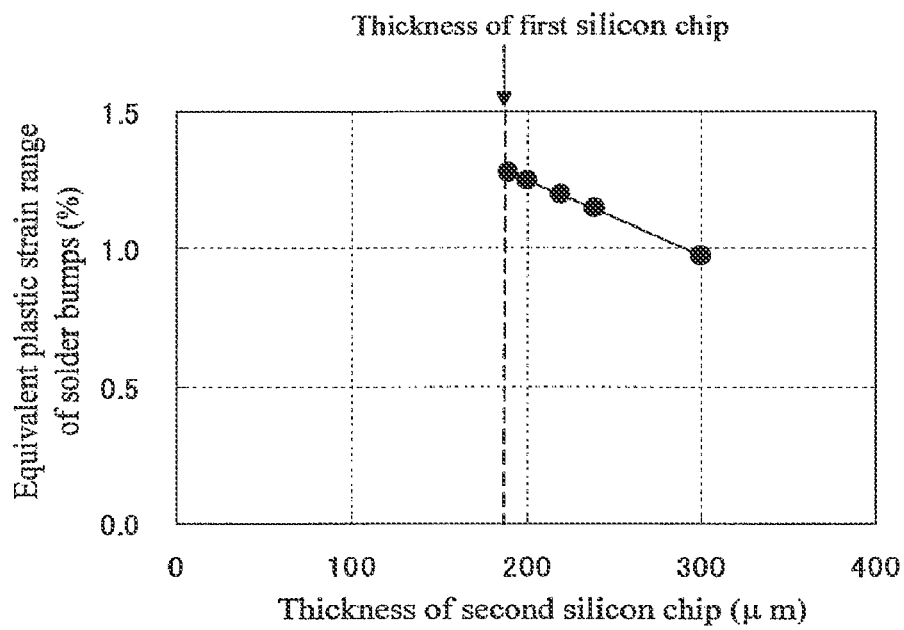
FIG. 4 is a graph showing the relationship between the thickness of the second silicon chip and the equivalent plastic strain range of the solder bumps.

Table 1 is a table showing the relationship between the thickness of second silicon chip 12 and the equivalent plastic strain range of solder bumps 37 that are inter-board connection terminals. FIG. 4 is a graph showing the relationship between the thickness of second silicon chip 12 and the equivalent plastic strain range of solder bumps 37 that are inter-board connection terminals.

Referring to the table and the graph, when the thickness of second silicon chip 12 is thick, the value of the equivalent plastic strain range decreases compared with the case where the thickness of first silicon chip 2 and the thickness of second silicon chip 12 are the same.

It is known that the fatigue failure of solder bumps 37 occurs earlier as the equivalent plastic strain range increases. The relationship between connection life Nf due to fatigue failure of the solder bumps and the equivalent plastic strain range $\Delta \epsilon_N$ satisfies the following formula referred to as the Coffin-Manson law.

$$Nf = C(\Delta \epsilon_{eq})^{-\alpha} \qquad \text{[Formula 1]}$$

In the formula, C and $\alpha$ are the values of properties depending on the composition of the solder and environment. The value of $\alpha$ is positive, so that as the equivalent plastic strain range decreases, the connection life Nf of the solder bumps increases. For generally used solder (Sn-3Ag-0.5Cu), the value of $\alpha$ is about 2.

Figure 5:
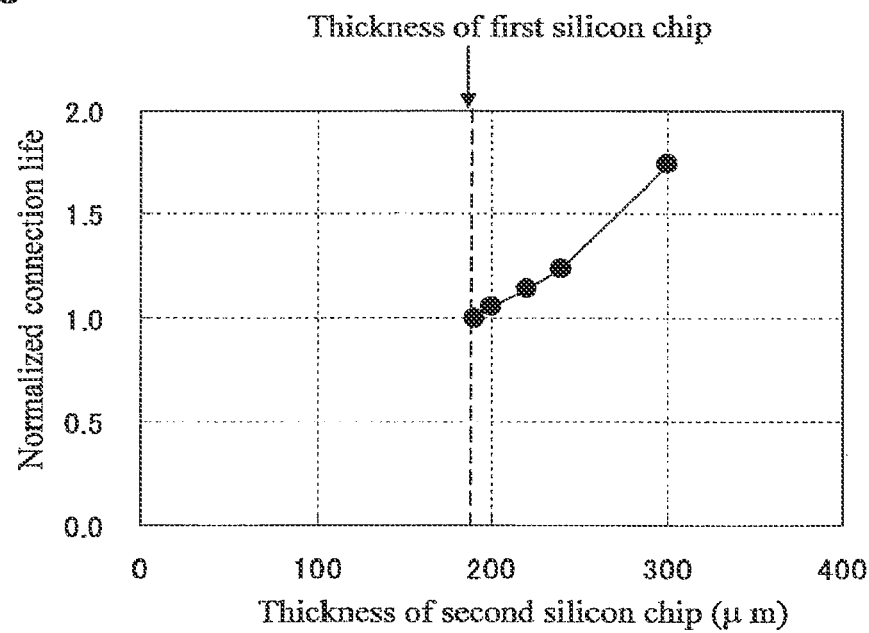
FIG. 5 is a graph showing the relationship between the thickness of the second silicon chip and the connection life of the solder bumps.

FIG. 5 is a graph showing the relationship between the connection life of solder bumps 37 and the thickness of second silicon chip 12. The vertical axis in FIG. 5 is connection life that has been normalized so that the connection life is 1 when the thickness of first silicon chip 2 and the thickness of second silicon chip 12 are the same. Referring to FIG. 5, when the thickness of second silicon chip 12 is thick, the connection life is improved because the difference in warpage deformation between first semiconductor device 8 and second semiconductor device 18 is reduced, so that the load on solder bumps 37 decreases. When the thickness of first silicon chip 2 is 190 µm, and the thickness of second silicon chip 12 is 300 µm, the connection life is about twice compared with the case where first silicon chip 2 and second silicon chip 12 have the same thickness.

A manufacturing method for the stacked-type semiconductor device in this exemplary embodiment will be described below. In one exemplary embodiment, a method for manufacturing a stacked-type semiconductor device comprises preparing a first semiconductor chip and at least one second semiconductor chip whose thickness is thicker than the thickness of the first semiconductor chip, forming a first semiconductor device such as mounting the first semiconductor chip on a wiring board, forming a second semiconductor device by mounting the second semiconductor chip on a wiring board, and stacking the second semiconductor device on the first semiconductor device.

Specifically, the desired circuit is formed on a silicon wafer, using publicly known means. Subsequently, the back surface of the silicon wafer is polished. By changing the amount by which two silicon wafers will be polished, two silicon wafers with different thickness are prepared.

Next, respective silicon wafers are diced to prepare two types of silicon chips having different thicknesses. Thicker silicon chip 12 is mounted on tape board 13 via elastomer 14. Similarly, thinner silicon chip 2 is mounted on tape board 3 via elastomer 4. Then, tape board 13 on which thicker silicon chip 12 is mounted is stacked on tape board 3 on which thinner silicon chip 2 is mounted. By reflowing in this state, a stacked-type semiconductor device in which second semiconductor device 18 comprising thick silicon chip 12 is stacked on first semiconductor device 8 comprising thin silicon chip 2 is manufactured. The thickness of first and second silicon chips 2 and 12 can be suitably adjusted as required.

When this stacked-type semiconductor device is mounted on a motherboard, the motherboard and tape board 3 of first semiconductor device 8 may be connected by reflow. This reflow may be performed simultaneously with the reflow when first semiconductor device 8 and second semiconductor device 18 are stacked.

Second Exemplary Embodiment

Figure 6:
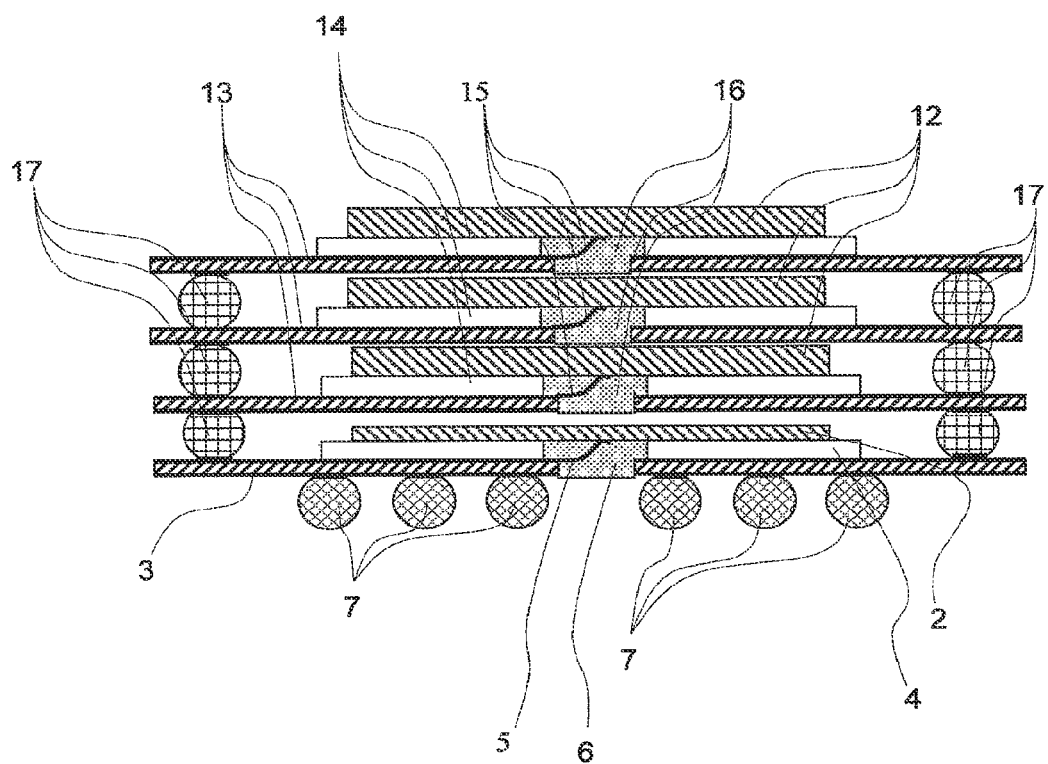
FIG. 6 is a schematic cross-sectional view of a stacked-type semiconductor device according to a second exemplary embodiment.

FIG. 6 is a schematic cross-sectional view of a stacked-type semiconductor device according to a second exemplary embodiment. In the stacked-type semiconductor device according to this exemplary embodiment, a first semiconductor device and three second semiconductor devices are stacked. The configuration of the first and second semiconductor devices is similar to the configuration in the first exemplary embodiment. The first semiconductor device comprises solder balls 7 that are external connection terminals. The three second semiconductor devices comprise solder balls 17 that are inter-board connection terminals.

The arrangement of solder balls 7 that are external connection terminals conforms to the JEDEC standard. On the other hand, solder balls 17 that are inter-board connection terminals are arranged parallel to each other near both ends of tape board 13 in the second semiconductor device. The thickness of second silicon chip 12 of the second semiconductor device is thicker than the thickness of first silicon chip 2 of first semiconductor device. Thus, as in the first exemplary embodiment, the warpage deformation of the second semiconductor device is reduced, and the connection life of solder balls 17 is extended.

It is desirable that the thickness of three second silicon chips 12 be substantially the same. Thus, the difference in warpage deformation among the second semiconductor devices in layers decreases. Thus, the fatigue failure of solder balls 17 that are inter-board connection terminals is reduced, and the reliability of the stacked-type semiconductor device is improved.

In this exemplary embodiment, the thickness of three second silicon chips 12 is the same, but the thickness of three second silicon chips 12 may be different. When the thickness of second silicon chip 12 is thicker than the thickness of first silicon chip 2, the difference in warpage deformation among the semiconductor devices in layers can be reduced.

Also, it is desirable that solder balls 17 in layers be at substantially the same positions. Thus, the difference in warpage deformation among the second semiconductor devices in layers is reduced. In this exemplary embodiment, the positions of solder balls 17 in layers are the same, but the positions of solder balls 17 may be different.

It should be understood that the present invention is not limited to the above exemplary embodiments and that various changes and modifications can be made without departing from the gist thereof. For example, in the above-described exemplary embodiments, the connection pad is arranged in the center of silicon chips 2 and 12, but the arrangement of the connection pad is not limited to this. The connection pad may be arranged on the periphery of silicon chips 2 and 12. The arrangement of solder balls 7 that are external connection terminals is not limited to an arrangement that conforms to the JEDEC standard. Further, the type of silicon chips 2 and 12 is not particularly limited, and silicon chips 2 and 12 may be of different types.

In the first and second exemplary embodiments, the inter-board connection terminals and the external connection terminals are solder balls 7 and 17, but the present invention is not limited to this. In other words, instead of the solder balls, metal bumps (projecting electrodes) may used. The material of the metal bump is not particularly limited and may be, for example, a composite material that combines a Cu post and solder.

In an exemplary embodiment, the stacked-type semiconductor device may be any stacked-type semiconductor device as long as the thickness of the second semiconductor chip of the second semiconductor device comprising the inter-board connection terminals is larger than the thickness of the first semiconductor chip of the first semiconductor device comprising the external connection terminals.

Although the inventions has been described above in connection with several preferred embodiments thereof, it will be appreciated by those skilled in the art that those embodiments are provided solely for illustrating the invention, and should not be relied upon to construe the appended claims in a limiting sense.

The invention claimed is:

1. A method comprising;
providing a first semiconductor device that comprises a first wiring board including first and second surfaces opposite to each other, a first semiconductor chip mounted over the first surface of the first wiring board and a plurality of first bump electrodes disposed on the second surface of the first wiring board;
providing a second semiconductor device that comprises a second wiring board including third and fourth surfaces opposite to each other, a second semiconductor chip mounted over the third surface of the second wiring board and a plurality of second bump electrodes disposed on the fourth surface of the second wiring board, the second semiconductor chip being greater in thickness than the first semiconductor chip; and
stacking the second semiconductor device over the first semiconductor device such that the second bump electrodes are in contact with the first surface of the first wiring board of the first semiconductor device.

2. The method as claimed in claim 1, wherein at least one of the first bump electrodes is disposed on an area of the second surface of the first wiring board that overlaps with the first semiconductor chip, and any bump electrodes including the second bump electrodes are free from being disposed on an area of the fourth surface of the second wiring board that overlaps with the second semiconductor chip.

3. The method as claimed in claim 1, wherein the second surface of the first wiring board includes a first area in which the first bump electrodes are disposed and a second area that surrounds the first area, the first surface of the first wiring board includes third and fourth areas being opposite respectively to the first and the second areas of the second surface, the first semiconductor chip is disposed in the third area, and the second bump electrodes in contact with the fourth area of the first wiring board.

4. The method as claimed in claim 1, wherein the stacking the second semiconductor device over the first semiconductor device is performed without an intervention of any other semiconductor chips except for the first semiconductor chip between the first wiring board of the first semiconductor device and the second wiring board of the second semiconductor device.

5. The method as claimed in claim 1, further comprising;
providing a third semiconductor device that comprises a third wiring board including fifth and sixth surfaces opposite to each other, a third semiconductor chip mounted over the fifth surface of the third wiring board and a plurality of third bump electrodes disposed on the sixth surface of the third wiring board, the third semiconductor chip being substantially equal in thickness to the second semiconductor chip, and stacking the third semiconductor device over the second semiconductor device such that the third bump electrodes are in contact with the third surface of the second wiring board of the second semiconductor device.

6. The method as claimed in claim 1, wherein the first semiconductor chip includes a first chip surface facing the first surface of the first wiring board and a plurality of first pads formed in the first chip surface, and the first wiring board includes a plurality of first conductive wirings each coupled to associated one or ones of the first pads of the first semiconductor chip.

7. The method as claimed in claim 6, wherein the first chip surface of the first semiconductor chip includes a first region in which the first pads are formed, the first wiring board includes a first opening being vertically aligned with the first region of the first chip surface of the first semiconductor chip, the first semiconductor device further comprises a resin element provided in the first opening of the first wiring board and between the first region of the first chip surface of the first semiconductor chip and the first opening of the first wiring board, and each of the first conductive wirings is elongated up to the associated one or ones of the first pads of the first semiconductor chip through the resin element.

8. The method as claimed in claim 1, wherein the second semiconductor chip includes a second chip surface facing the third surface of the second wiring board and a plurality of second pads formed in the second chip surface, and the second wiring board includes a plurality of second conductive wirings each coupled to associated one or ones of the second pads of the second semiconductor chip.

9. The method as claimed in claim 8, wherein the second chip surface of the second semiconductor chip includes a second region in which the second pads are formed, the second wiring board includes a second opening being vertically aligned with the second region of the second chip surface of the second semiconductor chip, the second semiconductor device further comprises a resin element provided in the second opening of the second wiring board and between the second region of the second chip surface of the second semiconductor chip and the second opening of the second wiring board, and each of the second conductive wirings is elongated up to the associated one or ones of the second pads of the second semiconductor chip through the resin element.

10. The method as claimed in claim 6, wherein the second semiconductor chip includes a second chip surface facing the third surface of the second wiring board and a plurality of second pads formed in the second chip surface, and the second wiring board includes a plurality of second conductive wirings each coupled to associated one or ones of the second pads of the second semiconductor chip.

11. The method as claimed in claim 1, wherein the first semiconductor chip includes a first chip surface facing the first surface of the first wiring board, the second semiconductor chip includes a second chip surface facing the third surface of the second wiring board, and a distance between the first chip surface of the first semiconductor chip and the first surface of the first wiring board is substantially equal to a distance between the second chip surface of the second semiconductor chip and the third surface of the second wiring board.

12. The method as claimed in claim 11, wherein the first semiconductor device includes a first elastomer element sandwiched between the first chip surface of the first semiconductor chip and the first surface of the first wiring board, and the second semiconductor device includes a second elastomer element sandwiched between the second chip surface of the second semiconductor chip and the third surface of the second wiring board.

13. The method as claimed in claim 1, wherein the first wiring board is substantially equal in thickness to the second wiring board.

14. The method as claimed in claim 1, wherein the second surface of the first wiring board includes a first area that is opposed to the first semiconductor chip with respect to the first wiring board and the second area that surrounds the first area, and at least one of the first bump electrodes is in contact with the first area of the second surface of the first wiring board without being in contact with the second area of the second surface of the first wiring board.

15. The method as claimed in claim 14, wherein each of the first bump electrodes is in contact with the first area of the second surface of the first wiring board without being in contact with the second area of the second surface of the first wiring board.

16. The method as claimed in claim 1, wherein the first semiconductor chip is mounted in a face down manner over the first wiring board.

17. The method as claimed in claim 1, wherein the second semiconductor chip is mounted in a face down manner over the second wiring board.

18. A method comprising:
providing a stacking device, the providing the stacking device comprising;
providing a first semiconductor device that comprises a first wiring board including first and second surfaces opposite to each other, a first semiconductor chip mounted over the first surface of the first wiring board and a plurality of first bump electrodes disposed on the second surface of the first wiring board,
providing a second semiconductor device that comprises a second wiring board including third and fourth surfaces opposite to each other, a second semiconductor chip mounted over the third surface of the second wiring board and a plurality of second bump electrodes disposed on the fourth surface of the second wiring board, the second semiconductor chip being thicker in thickness than the first semiconductor chip, and
stacking the second semiconductor device over the first semiconductor device to provide a stacking device such that the second bump electrodes are in contact with the first surface of the first wiring board of the first semiconductor device, and
mounting the stacking device over a circuit board.

19. The method as claimed in claim 18, wherein the first wiring board is substantially equal in thickness to the second wiring board.

20. The method as claimed in claim 18, wherein the first semiconductor chip is mounted in a face down manner over the first wiring board.

* * * * *